United States Patent
Kittl et al.

(10) Patent No.: US 10,297,673 B2
(45) Date of Patent: May 21, 2019

(54) METHODS OF FORMING SEMICONDUCTOR DEVICES INCLUDING CONDUCTIVE CONTACTS ON SOURCE/DRAINS

(71) Applicants: Jorge A. Kittl, Round Rock, TX (US); Ganesh Hegde, Austin, TX (US); Rwik Sengupta, Austin, TX (US); Borna J. Obradovic, Leander, TX (US); Mark S. Rodder, Dallas, TX (US)

(72) Inventors: Jorge A. Kittl, Round Rock, TX (US); Ganesh Hegde, Austin, TX (US); Rwik Sengupta, Austin, TX (US); Borna J. Obradovic, Leander, TX (US); Mark S. Rodder, Dallas, TX (US)

(73) Assignee: Samsung Electronics Co., Ltd. (KR)

( * ) Notice: Subject to any disclaimer, the term of this patent is extended or adjusted under 35 U.S.C. 154(b) by 718 days.

(21) Appl. No.: 14/878,230

(22) Filed: Oct. 8, 2015

(65) Prior Publication Data

US 2016/0104787 A1    Apr. 14, 2016

Related U.S. Application Data

(60) Provisional application No. 62/061,570, filed on Oct. 8, 2014.

(51) Int. Cl.
*H01L 29/66* (2006.01)
*H01L 29/417* (2006.01)
*H01L 21/285* (2006.01)
*H01L 23/485* (2006.01)
*H01L 29/78* (2006.01)
(Continued)

(52) U.S. Cl.
CPC ...... *H01L 29/665* (2013.01); *H01L 21/28512* (2013.01); *H01L 21/28518* (2013.01); *H01L 23/485* (2013.01); *H01L 29/41725* (2013.01); *H01L 29/41791* (2013.01); *H01L 29/66545* (2013.01); *H01L 29/66795* (2013.01); *H01L 21/76843* (2013.01); *H01L 29/165* (2013.01); *H01L 29/7848* (2013.01)

(58) Field of Classification Search
CPC ....................................................... H01L 29/66
See application file for complete search history.

(56) References Cited

U.S. PATENT DOCUMENTS

| | | |
|---|---|---|
| 5,834,846 A | 11/1998 | Shinriki et al. |
| 7,868,412 B2 | 1/2011 | Okamoto et al. |
| 7,932,556 B2 | 4/2011 | Pah |

(Continued)

*Primary Examiner* — Marvin Payen
(74) *Attorney, Agent, or Firm* — Myers Bigel, P.A.

(57) ABSTRACT

Methods of forming a semiconductor device are provided. The methods may include forming a plurality of fin-shaped channels on a substrate, forming a gate structure crossing over the plurality of fin-shaped channels and forming a source/drain adjacent a side of the gate structure. The source/drain may cross over the plurality of fin-shaped channels and may be electrically connected to the plurality of fin-shaped channels. The methods may also include forming a metallic layer on an upper surface of the source/drain and forming a conductive contact on the metallic layer opposite the source/drain. The conductive contact may have a first length in a longitudinal direction of the metallic layer that is less than a second length of the metallic layer in the longitudinal direction of the metallic layer.

20 Claims, 18 Drawing Sheets

(51) Int. Cl.
  *H01L 29/165* (2006.01)
  *H01L 21/768* (2006.01)

(56) References Cited

U.S. PATENT DOCUMENTS

| | | |
|---|---|---|
| 8,258,057 B2 | 9/2012 | Kuhn et al. |
| 8,415,250 B2 | 4/2013 | Alptekin et al. |
| 8,569,810 B2 | 10/2013 | Yu et al. |
| 2012/0187460 A1 | 7/2012 | Lavoie et al. |
| 2013/0171795 A1 | 7/2013 | Pei et al. |
| 2014/0203370 A1 | 7/2014 | Maeda et al. |
| 2014/0206190 A1 | 7/2014 | Li et al. |
| 2015/0035023 A1* | 2/2015 | Kim .................... H01L 29/785 257/288 |

* cited by examiner

METHODS OF FORMING SEMICONDUCTOR DEVICES INCLUDING CONDUCTIVE CONTACTS ON SOURCE/DRAINS

CROSS-REFERENCE TO RELATED APPLICATION

The present application claims priority under 35 U.S.C. § 119 to U.S. Provisional Application Ser. NO. 62/061,570, filed on Oct. 8, 2014, the entire content of which is incorporated herein by reference as if set forth in its entirety.

FIELD

The inventive concepts generally relate to the field of electronics, and more particularly to semiconductor devices.

BACKGROUND

Parasitic resistance and capacitance may degrade performance of semiconductor devices. With scaling, parasitic resistance and capacitance may increase and may need to be reduced for high performance semiconductor devices.

SUMMARY

A method of forming a semiconductor device may include forming a plurality of fin-shaped channels on a substrate, forming a gate structure crossing over the plurality of fin-shaped channels and forming a source/drain adjacent a side of the gate structure. The source/drain may cross over the plurality of fin-shaped channels and may be electrically connected to the plurality of fin-shaped channels. The method may also include forming a metallic layer on an upper surface of the source/drain and forming a conductive contact on the metallic layer opposite the source/drain. The conductive contact may have a first length in a longitudinal direction of the metallic layer that is less than a second length of the metallic layer in the longitudinal direction of the metallic layer.

According to various embodiments, forming the metallic layer may include forming an insulation layer on the gate structure and the source/drain, forming an opening extending through the insulation layer and exposing at least a portion of the source/drain and forming the metallic layer on the source/drain.

In various embodiments, the second length of the metallic layer in the longitudinal direction of the metallic layer may be greater than a distance between two adjacent ones of the plurality of fin-shaped channels.

In various embodiments, the insulation layer may include a first insulation layer, and forming the gate structure may include forming a dummy gate structure crossing over the plurality of fin-shaped channels, forming a second insulation layer on sides of the dummy gate structure and replacing the dummy gate structure with a gate insulation layer and a gate electrode. The gate electrode may include a metal.

In various embodiments, the insulation layer may include a first insulation layer, and forming the conductive contact may include forming a second insulation layer on the metallic layer in the opening, forming a contact opening extending through the second insulation layer and exposing the metallic layer and forming the conductive contact in the contact opening.

According to various embodiments, the metallic layer may include a silicide layer and/or a stack of layers. The stack of layers may include a stack including a dielectric layer and a metal layer or a stack including a rare-earth or alkaline earth metal layer, a metal layer and a capping layer.

In various embodiments, forming the source/drain and the metallic layer may include forming an insulation layer on the plurality of fin-shaped channels and the gate structure, forming an opening extending through the insulation layer and exposing the plurality of fin-shaped channels, forming the source/drain in the opening by performing a epitaxial growth process using the plurality of fin-shaped channels that are exposed by the opening as seed layers and forming the metallic layer on the source/drain.

A method of forming a semiconductor device may include forming a plurality of fin-shaped channels on a substrate, forming a gate structure crossing over the plurality of fin-shaped channels and forming a source/drain adjacent a side of the gate structure. The source/drain may cross over the plurality of fin-shaped channels and may be electrically connected to the plurality of fin-shaped channels. The method may also include forming a metallic layer on an upper surface of the source/drain and forming a conductive contact on the metallic layer opposite the source/drain. The conductive contact may vertically overlap less than all of the plurality of fin-shaped channels.

In various embodiments, the metallic layer may vertically overlap a first number of the plurality of fin-shaped channels that is greater than a second number of the plurality of fin-shaped channels that the conductive contact vertically overlaps.

According to various embodiments, the metallic layer may vertically overlap all of the plurality of fin-shaped channels.

In various embodiments, the conductive contact may vertically overlap only a portion of the metallic layer in a longitudinal direction of the metallic layer.

In various embodiments, forming the metallic layer and the conductive contact may include forming a first insulation layer on the gate structure and the source/drain, forming an opening extending through the insulation layer and exposing the source/drain, forming the metallic layer on the source/drain, forming a second insulation layer on the metallic layer in the opening, forming a contact opening extending through the second insulation layer and exposing the metallic layer and forming the conductive contact in the contact opening.

According to various embodiments, forming the gate structure may include forming a dummy gate structure crossing over the plurality of fin-shaped channels, forming a third insulation layer on sides of the dummy gate structure and replacing the dummy gate structure with a gate insulation layer and a gate electrode. The gate electrode may include a metal.

According to various embodiments, the metallic layer may include a silicide layer and/or a stack of layers. The stack of layers may include a stack including a dielectric layer and a metal layer or a stack including a rare-earth or alkaline earth metal layer, a metal layer and a capping layer.

A method of forming a semiconductor device may include forming a plurality of fin-shaped channels on a substrate, forming a gate structure crossing over the plurality of fin-shaped channels and forming a source/drain adjacent a side of the gate structure. The source/drain may cross over the plurality of fin-shaped channels and may be electrically connected to the plurality of fin-shaped channels. The method may also include forming a conductive contact on an upper surface of the source/drain. The conductive contact may have a first length in a longitudinal direction of the source/drain that is less than a second length of the source/drain in the longitudinal direction of the source/drain.

According to various embodiments, the conductive contact may vertically overlap only a portion of the plurality of fin-shaped channels.

In various embodiments, the method may further include forming a metallic layer between the source/drain and the conductive contact. The metallic layer may have a third length in the longitudinal direction of the source/drain that is greater than the first length of the conductive contact.

According to various embodiments, the method may further include forming a metallic layer between the source/drain and the conductive contact. Forming the metallic layer and the conductive contact may include forming a first insulation layer on the gate structure and the source/drain, forming an opening extending through the insulation layer and exposing the source/drain, forming the metallic layer on the source/drain, forming a second insulation layer on the metallic layer in the opening, forming a contact opening extending through the second insulation layer and exposing the metallic layer and forming the conductive contact in the contact opening. The conductive contact may contact the metallic layer.

According to various embodiments, forming the gate structure may include forming a dummy gate structure crossing over the plurality of fin-shaped channels, forming a third insulation layer on sides of the dummy gate structure and replacing the dummy gate structure with a gate insulation layer and a gate electrode. The gate electrode may include a metal.

In various embodiments, the metallic layer may include a silicide layer and/or a stack of layers. The stack of layers may include a stack including a dielectric layer and a metal layer or a stack including a rare-earth or alkaline earth metal layer, a metal layer and a capping layer.

DETAILED DESCRIPTION

Pursuant to embodiments of the inventive concepts, methods of forming semiconductor devices including low parasitic resistance and low parasitic capacitance contacts are provided. The methods may include forming a metallic layer on a source/drain to reduce parasitic resistance and forming a contact that vertically overlaps only a portion of the metallic layer to reduce parasitic capacitance. According to embodiments of the inventive concepts, a metallic layer may be formed after a high temperature process (e.g., a replacement gate process) is performed, degradation of the metallic layer thus may be reduced.

Methods and devices according to embodiments of the inventive concepts will now be discussed in more detail with reference to the attached drawings, in which example embodiments of these methods and semiconductor devices and intermediate structures are shown.

Figure 1:
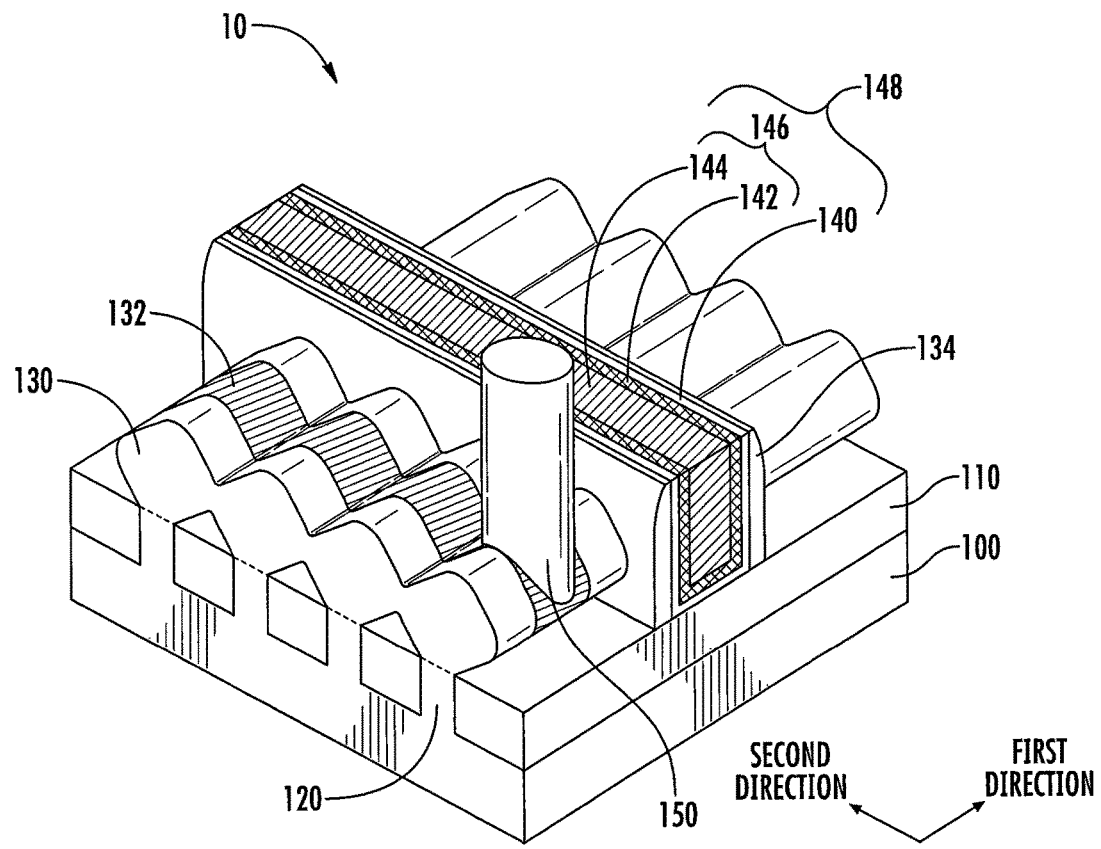
FIG. 1 is a perspective view of a semiconductor device according to some embodiments of the inventive concepts.

FIG. 1 is a cross-sectional view of a semiconductor device according to some embodiments of the inventive concepts. Referring to FIG. 1, the semiconductor device 10 may include an isolation layer 110 and fin structures 120 on a substrate 100. The fin structures 120 may extend in a first direction. The fin structures 120 may be buried in the isolation layer 110 as illustrated in FIG. 1. In some embodiments, the fin structures 120 may protrude above the isolation layer 110. Although four fin structures 120 are shown in FIG. 1, it will be understood that the device 10 may include more than four fin structures 120.

The substrate 100 may include, for example, Si, Ge, SiGe, GaP, GaAs, SiC, SiGeC and/or InP. The substrate 100 may be, for example, a bulk silicon substrate or a silicon-on-insulator (SOI) substrate. The isolation layer 110 may include an insulation material such as, for example, silicon oxide. The fin structures 120 may include, for example, Si, Ge, SiGe, GaP, GaAs, SiC, SiGeC and/or InP. The fin structures 120 need not be the same materials as the substrate 100.

The device 10 may also include a gate structure 148 on the fin structures 120. The gate structure 148 may extend in a second direction that is different from the first direction. In some embodiments, the first direction may be perpendicular to the second direction, and the first direction and the second direction may each be parallel to a plane defined by the bottom surface of the substrate 100. The fin structures 120 under the gate structure 148 may provide non-planar channels (e.g., fin-shaped channels). The gate structure 148 may have a gate-last formed structure as shown in FIG. 1, which may be formed using, for example, a replacement metal gate process. Gate spacers 134 may be disposed on sides of the gate structure 148.

The gate structure 148 may include a gate insulation layer 140 and a gate electrode 146. The gate electrode 146 may include a stack of two layers including first and second gate electrodes 142 and 144. The first gate electrode 142 may be conformally formed on the gate insulation film 140 and the second gate electrode 144 may fill the gap defined by the first gate electrode 142. The first gate electrode 142 may include one of TiN, TaN, TiC and TaC. The second electrode 144 may include W or Al. In some embodiments, the gate electrode 146 may include more than two layers.

A source/drain 130 may be formed adjacent the side of the gate structure 148. The source/drain 130 may have a merged structure as shown in FIG. 1 where a plurality of individual source/drain regions that are formed on the fin structures 120 expand over the fin structures 120 to contact each other. The source/drain 130 may cross over the fin structures 120 and may contact upper surfaces of the fin structures 120. The source/drain 130 may vertically overlap all of the fin structures 120 (i.e., four fin structures). It will be understood that references herein to "an element A vertically overlapping an element B" (or similar language) means that at least one vertical line exists that intersects both the elements A and B and is vertical relative to the bottom surface of the substrate 100.

The individual source/drain regions of the source/drain 130 may have a generally diamond shaped cross-section as shown in FIG. 1 to increase a contact area between the source/drain 130 and a metallic layer 132 that is described below. It will be understood that a cross-section of the portions of the source/drain 130 may be of various shapes.

In some embodiments, the source/drain 130 may include a material having a resistivity less than a resistivity of a material included in the fin structures 120 to reduce parasitic source/drain resistance. Reduced parasitic source/drain resistance may increase the current carried by the device 10. The source/drain 130 may include, for example, doped Si, SiGe, or SiC.

In some embodiments, the source/drain 130 may include a stressor material, which increases channel mobility of the device 10 and thus may increase the current carried by the device 10. Appropriate stress applied to a channel such as, for example, by materials having a different lattice constant may improve the mobility of carriers and increase the amount of current carried by the device 10. For example, a stressor material having a greater lattice constant than the substrate 100 in a P-type transistor (e.g., SiGe if the substrate 100 is Si) may apply compressive stress to the channel of the P-type transistor and thus increase the current. A stressor material having a lattice constant that is less than that of the substrate 100 in an N-type transistor (e.g., SiC if the substrate 100 is Si) may apply tensile stress to the channel of the N-type transistor and thus increase the current.

The device 10 may include a metallic layer 132 on the source/drain 130. The metallic layer 132 may contact an upper surface of the source/drain 130. The metallic layer may extend in the second direction and may vertically overlap all of the fin structures 120 (i.e., four fin structures) as illustrated in FIG. 1. In some embodiments, the metallic layer 132 may have a length in the second direction that is similar to or substantially equal to a length of the source/drain 130 in the second direction. In some embodiments, the metallic layer 132 may have a length in the second direction that is shorter than a length of the source/drain 130 in the second direction.

A thickness of the metallic layer 132 may be determined considering parasitic capacitance and parasitic resistance. It will be understood that parasitic capacitance between the source/drain 130 and the gate structure 148 increases as the thickness of the metallic layer 132 increases. It will be also understood that the sheet resistance of the source/drain 130 increases as the thickness of the metallic layer 132 decreases. In some embodiments, the metallic layer 132 may be a silicide layer or a reacted metal-semiconductor compound layer formed by the reaction of a metal with a material included in the source/drain 130. For example, the metallic layer 132 may include NiSi(Ge), Ti-germano-silicide, NiSi(C), Ti—Si (C) alloys, Ni-semiconductor alloys, Ni—Pt-semiconductor alloys, Co-semiconductor alloys or Ta-semiconductor alloys. The thickness of the silicide layer may be about less than 20 nanometer (nm) and may have a sheet resistance of less than about 40 ohm/sq.

In some embodiments, the metallic layer 132 may be a stack of layers that includes an insulation layer and a metal layer (together with the upper surface of the source/drain 130) to form a metal-insulator-semiconductor (MIS) contact. The insulation layer of the MIS contact may include, for example, TiQx or ZnQ, and may have a thickness about 1 nm. The metal layer of the MIS contact may include, for example, Ni, Ti, Ta, TaN, TiN, TiC, W, TiAl, Ru, Al, La, Co, Pt, Pd, Mo or alloys thereof. In some embodiments, if the gate structure 148 is a gate of an N-type transistor, the metallic layer 132 may include a stack of layers including an interfacial layer, a low resistivity layer (e.g., Ti film) and a capping layer (e.g., TiN layer). The interfacial layer may include a thin rare-earth or alkaline earth metal layer. The capping layer may reduce or possibly prevent oxidation of the low resistivity layer.

The device 10 may include a contact 150 on the metallic layer 132. The contact 150 may contact the metallic layer 132. The contact 150 may vertically overlap one of the fin structures 120 as shown in FIG. 1 or may vertically overlap more than one but less than all of the fin structures 120 that are underneath the source/drain 130. Accordingly, the contact 150 may have a length in the second direction that is shorter than the length of the metallic layer 132 in the second direction. Although FIG. 1 illustrates that the contact 150 is on an edge portion of the source/drain 130 in the second direction of the source/drain 130, the contact 150 may be disposed on a middle portion of the source/drain 130. The contact 150 may include, for example, a semiconductor material and/or a metal. The metal may include Ni, Ti, Ta, TaN, TiN, TiC, W, TiAl, Ru, Al, La, Co, Pt, Pd, Mo or alloys thereof. An insulation layer (not shown) may be formed on the upper surface of the source/drain 130, the metallic layer 132, and the contact 150 may penetrate this insulation layer.

Although FIG. 1 illustrates that the source/drain 130, the metallic layer 132 and the contact 150 are formed on one side of the gate structure 148, it will be understood that the source/drain 130, the metallic layer 132 and the contact 150 may be formed on both sides of the gate structure 148. Further, although not shown in FIG. 1, it will be understood that the device 10 may also include insulation layers (e.g., first, second and third insulation layers 152, 154 and 156 in FIG. 10) that are formed on the source/drain 130 and the gate structure 148 and enclose the contact 150. The insulation layers may expose an uppermost surface of the contact 150.

Figure 2:
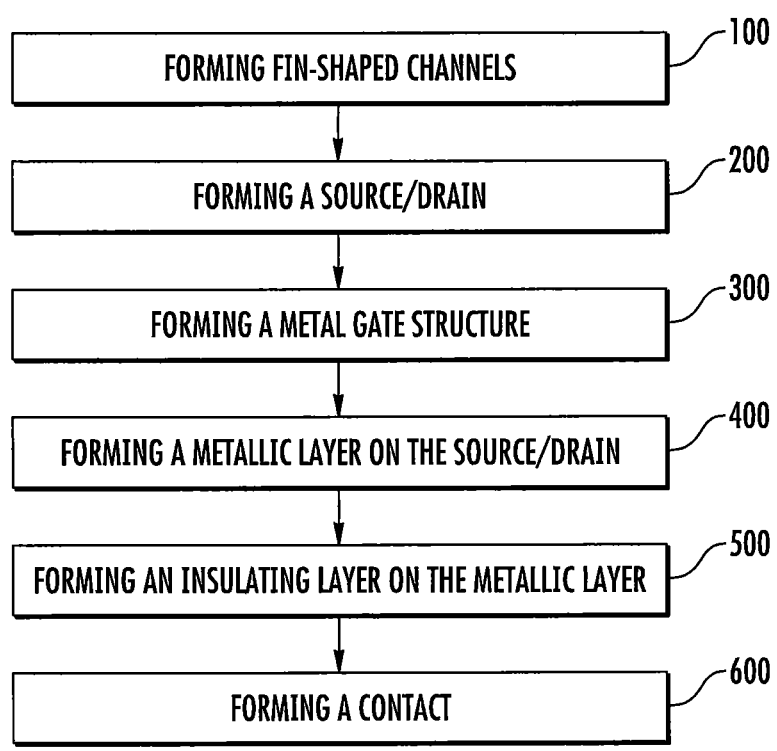
FIG. 2 is a flowchart illustrating operations of forming a semiconductor device according to some embodiments of the inventive concepts.

FIG. 2 is a flowchart illustrating operations of forming a semiconductor device according to some embodiments of the inventive concepts. Referring to FIG. 2, the operations may include forming fin-shaped channels on a substrate (Block 100) and forming a source/drain (Block 200). The operations may also include forming a metal gate structure on the fin-shaped channels (Block 300) and forming a metallic layer on the source/drain (Block 400). The operations may further include forming an insulation layer on the metallic layer (Block 500) and forming a contact in the insulation layer (Block 600).

Figure 3:
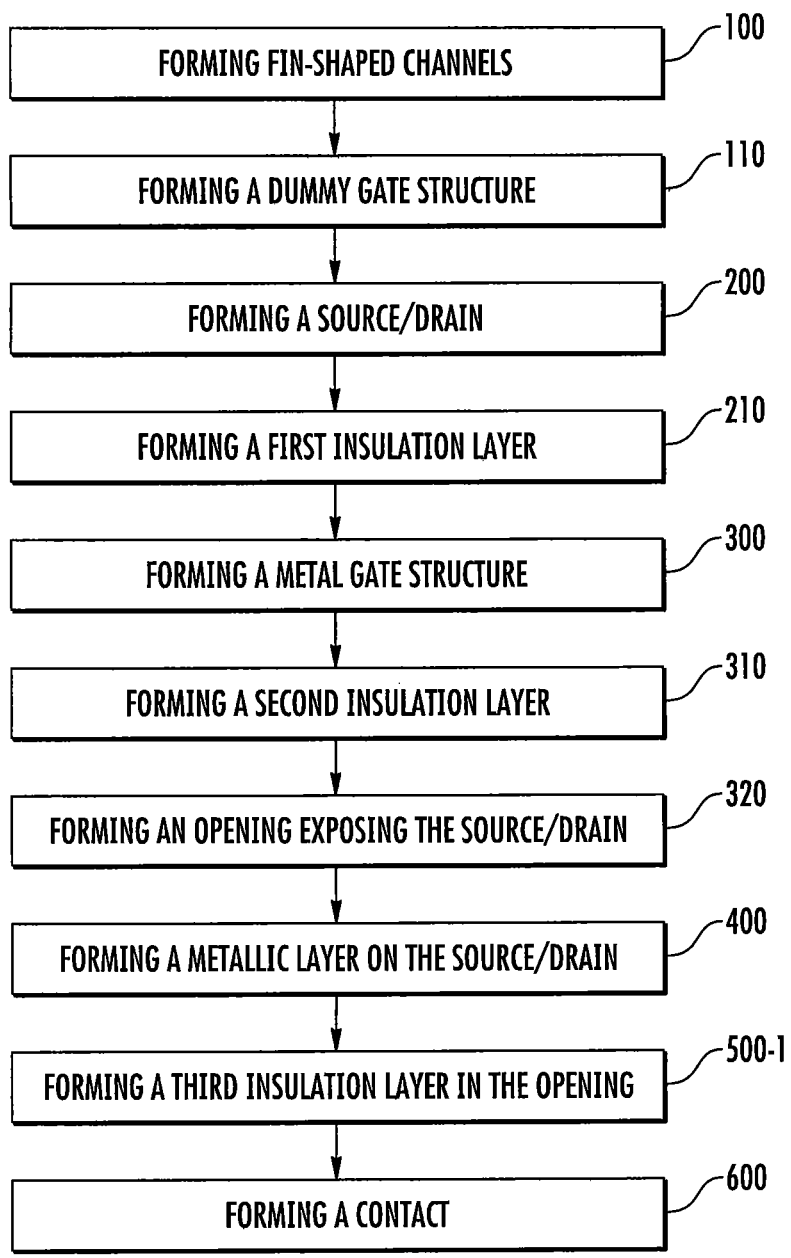
FIG. 3 is a flowchart illustrating operations of forming a semiconductor device according to some embodiments of the inventive concepts.
Figure 9:
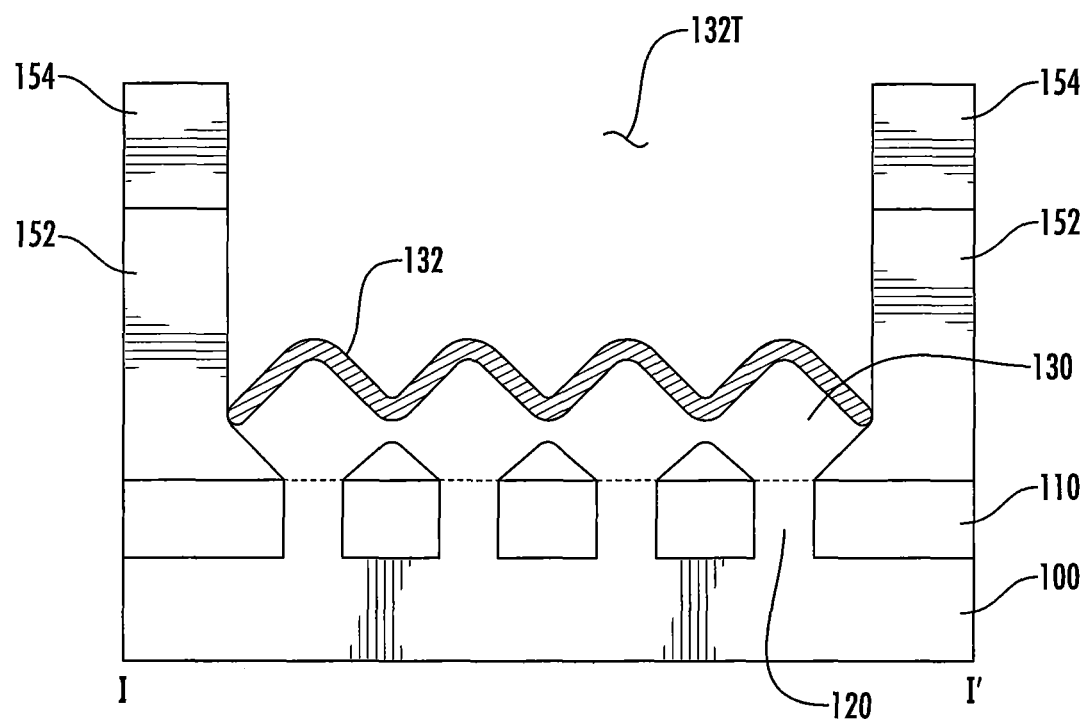
Figure 10:
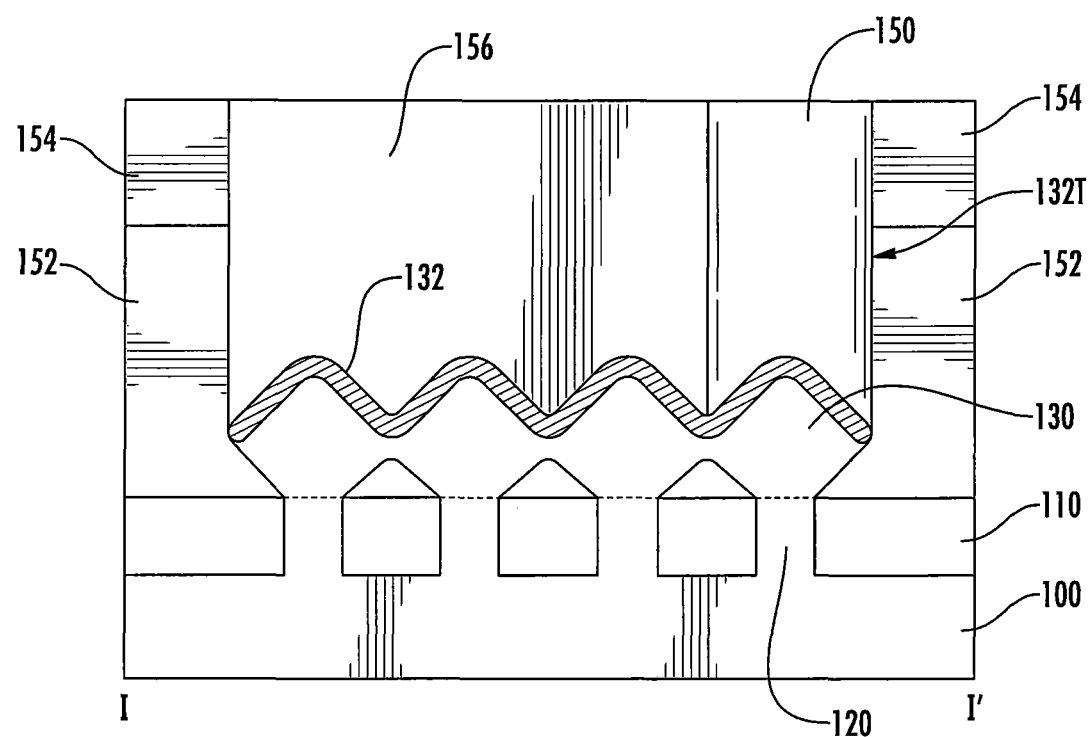

FIG. 3 is a flowchart illustrating operations for forming a semiconductor device according to some embodiments of the inventive concepts. FIGS. 4 through 8 are perspective views and FIGS. 9 and 10 are cross-sectional views illustrating intermediate structures provided in operations of forming a semiconductor device according to some embodiments of the inventive concepts.

Figure 4:
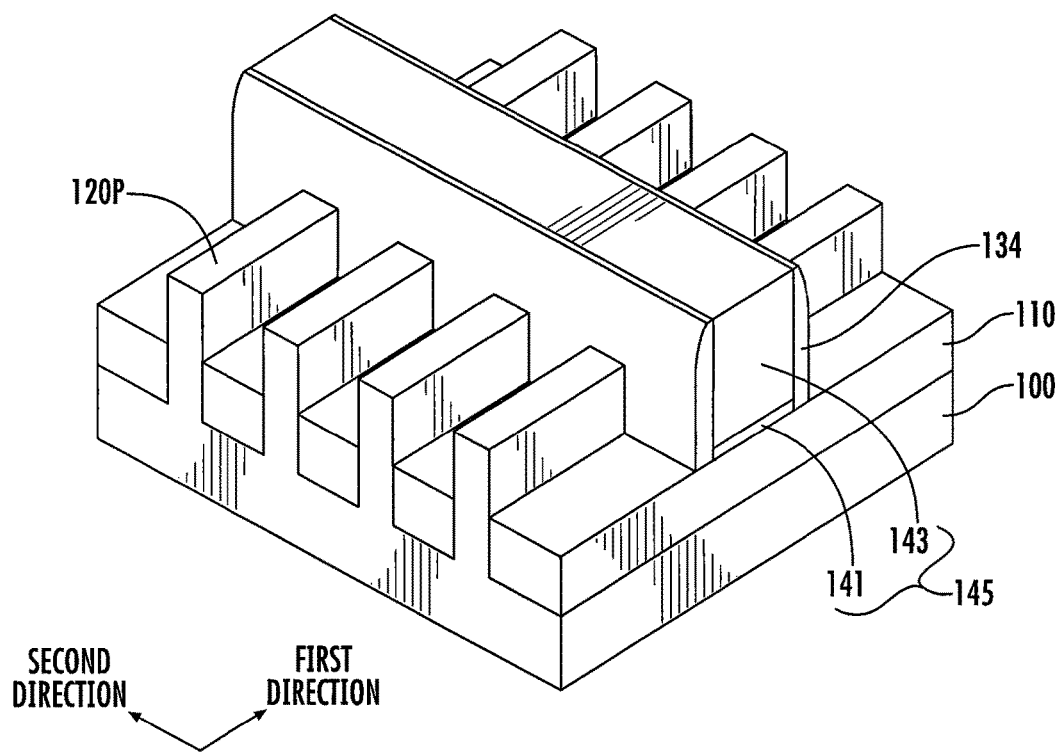
FIGS. 4 through 8 are perspective views and FIGS. 9 and 10 are cross-sectional views illustrating intermediate structures provided in operations of forming a semiconductor device according to some embodiments of the inventive concepts.

Referring to FIGS. 3 and 4, preliminary fin structures 120P may be formed on the substrate 100 (Block 100). The preliminary fin structures 120P may be spaced apart from each other and each may have a line shape. An isolation layer 110 may be formed on the substrate 100. A dummy gate structure 145 may be formed on the preliminary fin structures 120P and the isolation layer 110 (Block 110). Portions of the preliminary fin structures 120P under the dummy gate structure 145 provide fin-shaped channels. The dummy gate structure 145 may extend in a direction that is different from a direction in which the preliminary fin structures 120P extend. The dummy gate structure 145 may include a dummy gate insulation layer 141 and a dummy gate electrode 143. The dummy gate insulation layer 141 may include silicon oxide, and the dummy gate electrode 143 may include polysilicon. Gate spacers 134 may be formed on respective sides of the dummy gate structure 145. The gate spacers 134 may be provided by forming a spacer layer and then performing an etch process. The gate spacers 134 may include silicon nitride, aluminum nitride, silicon oxynitride or silicon carbide.

Figure 5:
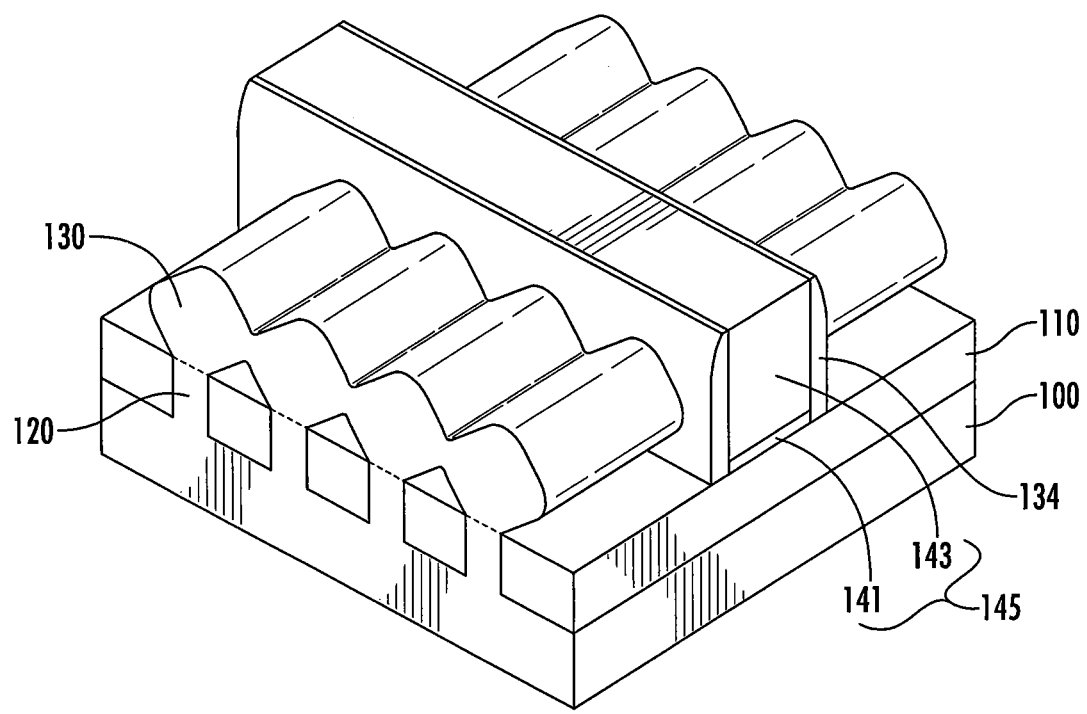

Referring to FIGS. 3 and 5, upper portions of the preliminary fin structures 120P that are exposed by the dummy gate structure 145 may be selectively removed to form the fin structures 120. It will be understood that regions exposed by the dummy gate structure 145 are referred to be as source/drain regions. The upper portions of the preliminary fin structures 120P may be removed by any appropriate etch process. Upper surfaces of the fin structures 120 in the source/drain regions may be at a substantially equal level to an upper surface of the isolation layer 110. In some embodiments, the upper surfaces of the fin structures 120 in the source/drain regions may be at a different level from the upper surface of the isolation layer 110. For example, the upper surfaces of the fin structures 120 may be lower than the upper surface of the isolation layer 110.

A source/drain 130 may be formed on the fin structures 120 (Block 200). The source/drain 130 may be formed using an epitaxial growth process using the fin structures 120 as seed layers. The epitaxial growth process may be performed until epitaxially grown individual source/drain regions that grow from the respective fin structures 120 merge into one structure. The source/drain 130 may include, for example, doped Si, SiGe, or SiC.

Figure 6:
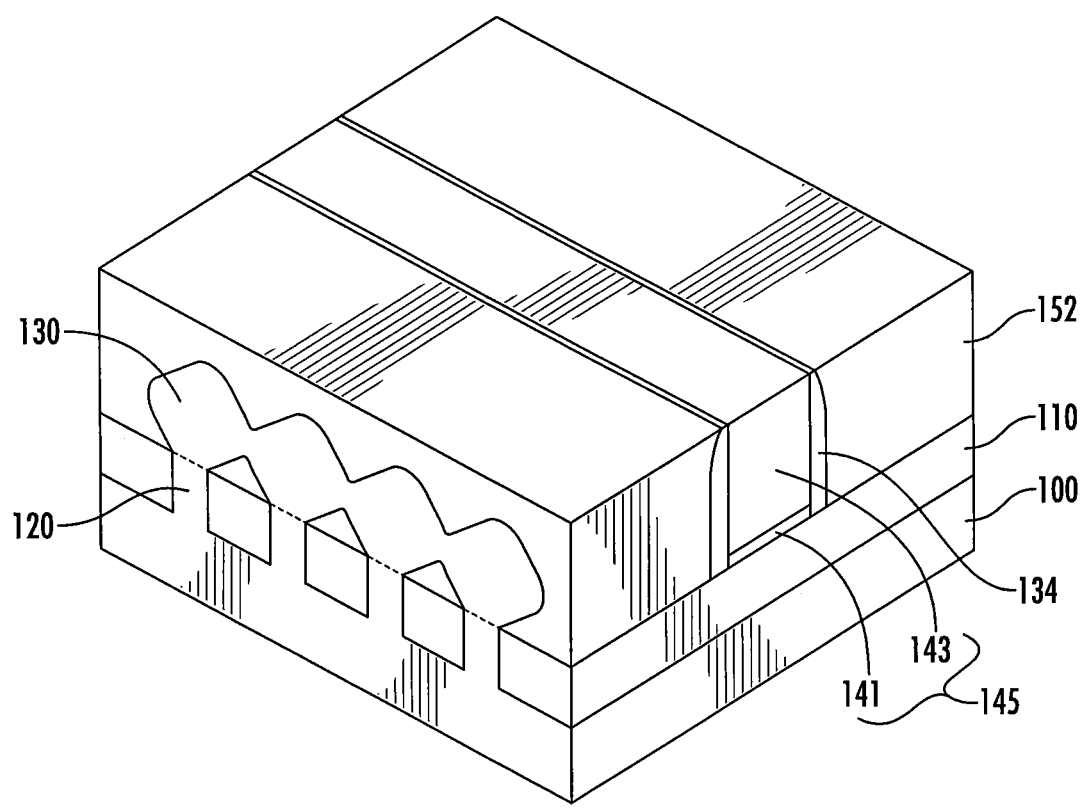

Referring to FIG. 6, a first insulation layer 152 may be formed on the structure illustrated in FIG. 5 (Block 210). The first insulation layer 152 may formed by depositing and planarizing an insulation layer. The first insulation layer 152 may expose the top surface of the dummy gate electrode 143.

Figure 7:
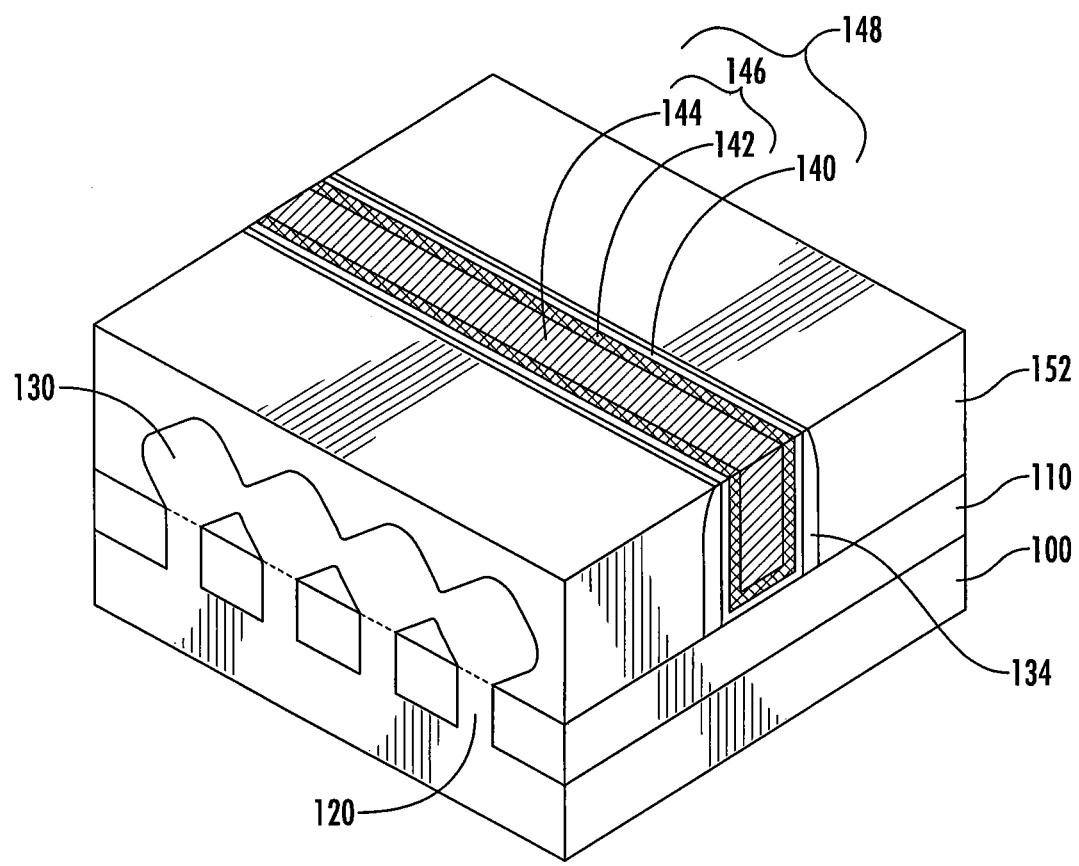

Referring to FIGS. 3 and 7, the dummy gate insulation layer 141 and the dummy gate electrode 143 may be replaced with a gate insulation layer 140 and a gate electrode 146 using, for example, a replacement metal gate process to form a gate structure 148 (Block 300). The dummy gate insulation layer 141 and the dummy gate electrode 143 may be removed by any appropriate etching process, wet and/or dry etch process, to form a trench defined by the opposed side walls of the gate spacers 134. Then the gate insulation layer 140 and the gate electrode 146 may be formed in the trench.

The gate insulation layer 140 may include a dielectric material such as, for example, silicon dioxide. In some embodiments, the gate insulation layer 140 may include a high-k material having a higher dielectric constant than a silicon oxide film such as, for example, hafnium oxide (HfO2), lanthanum oxide, (La2O3), zirconium oxide, (ZrO2), and tantalum oxide (Ta2O5). The gate insulation layer 140 may be conformally formed on the side walls and the bottom surface of the trench by, for example, atomic layer deposition (ALD). The gate electrode 146 may include the first and second gate electrodes 142 and 144. The first gate electrode 142 may be conformally formed on the gate insulation layer 140 and the second gate electrode 144 may fill a space formed by the first gate electrode 142. The first gate electrode 142 may include one of TiN, TaN, TiC and TaC. The second electrode 144 may include W or Al.

Figure 8:
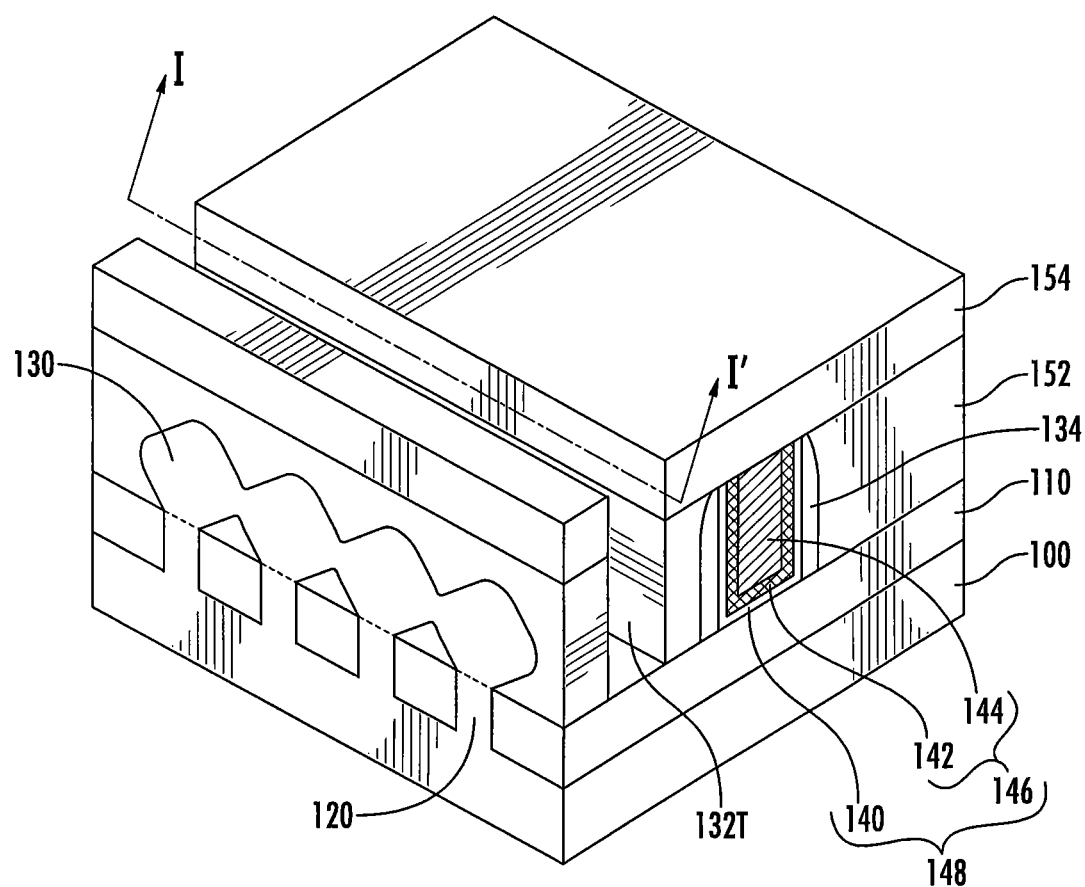

Referring to FIGS. 3 and 8, a second insulation layer 154 may be formed on the first insulation layer 152 and the gate structure 148 (Block 310). An opening 132T may be formed in the first and second insulation layers 152, 154 by etching portions of the first and second insulation layers 152, 154 until the source/drain 130 is exposed (Block 320). The opening 132T may have a line shape which has a length in the second direction that is greater than a distance between the directly adjacent fin structures 120 in the second direction. In some embodiments, the opening 132T may have a line shape which has a length in the second direction that is similar to or substantially equal to a length of the source/drain 130 in the second direction. The opening 132T may expose an upper surface of the source/drain 130.

Referring to FIGS. 3 and 9, a metallic layer 132 may be formed on the upper surface of the source/drain 130 that is exposed by the opening 132T (Block 400). The metallic layer 132 may be a silicide layer or stacked layers including a metal layer. In some embodiments, the metallic layer 132 may be a silicide layer that is formed by a self-aligned process. The self-aligned process may include forming a thin metal layer on the structure shown in FIG. 8 including on the upper surface of the source/drain 130. Then, the thin metal layer may thermally react with the source/drain 130 to produce a metal-semiconductor compound film and a portion of the metal layer that is not reacted may be selectively removed.

It will be understood that degradation of a silicide layer in the metallic layer 132 may be reduced according to some embodiments of the inventive concepts since the metallic layer 132 may be formed after the gate electrode 146 is formed. The replacement metal gate process requires a high temperature process that may cause severe degradation of a silicide layer (e.g., agglomeration resulting in discontinuous layer), resulting in high sheet resistance. According to some embodiments, the replacement metal gate process may be performed before forming the metallic layer 132, and metals that have low thermal stability may be used to form the metallic layer 132.

In some embodiments, the metallic layer 132 may include a metal layer that is formed by a directional deposition process (e.g., PVD process) followed by a removal of the metal layer from the sidewall of the opening 132T such that the metal layer is formed at the bottom of the opening 132T. Using a directional deposition process, the metal layer deposited at the bottom of the opening 132T is thicker than the metal layer deposited on the sidewall of the opening 132T, so that the metal layer on the sidewall of the opening 132T may be entirely removed while leaving a portion of the metal layer at the bottom of the opening 132T.

Referring to FIGS. 3 and 10, a third insulation layer 156 may be formed in the opening 132T (Block 500-1). The third insulation layer 156 may fill the opening 132T. A contact 150 may be formed in the third insulation layer 156 (Block 600-1). Forming the contact 150 may include forming a contact opening in the third insulation layer 156 and forming conductive materials in the contact opening. The contact 150 may extend through the third insulation layer 156 and may contact the metallic layer 132.

Figure 11:
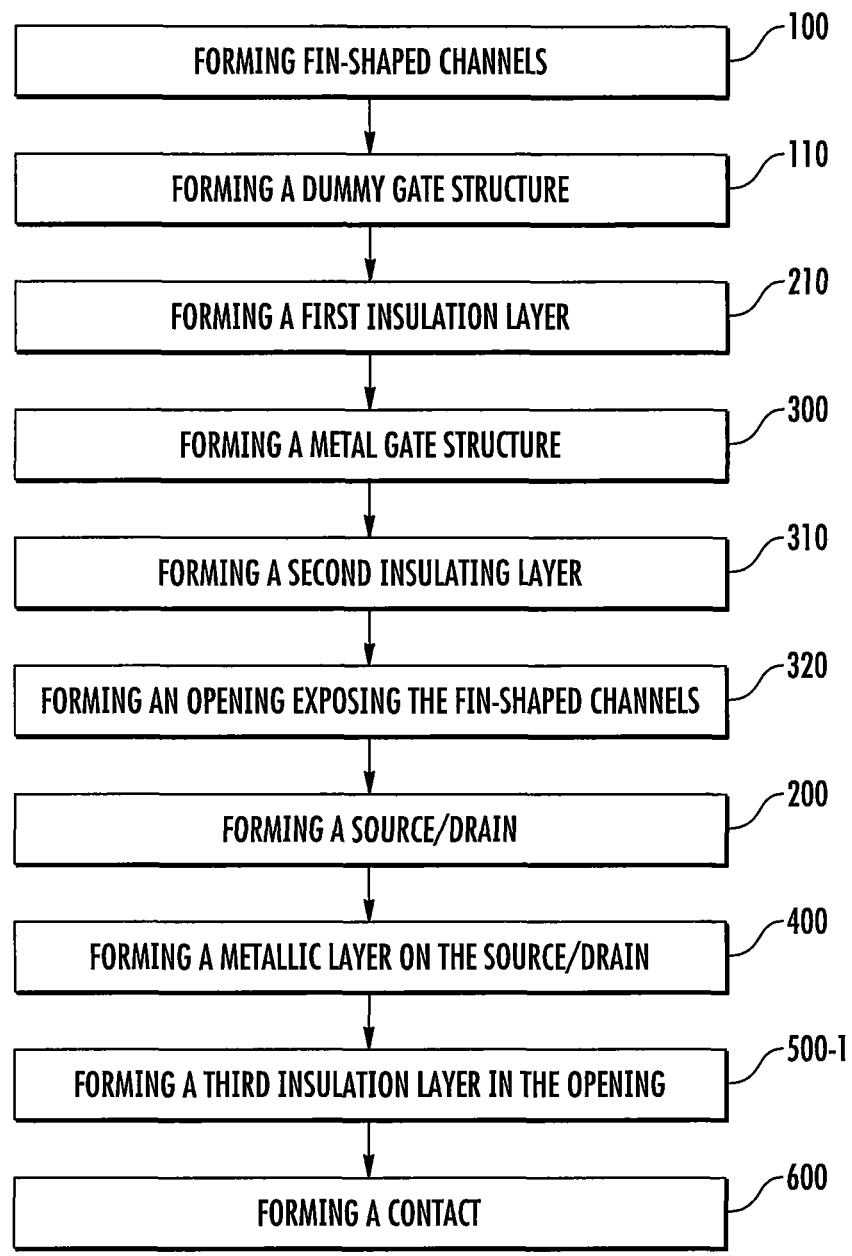
FIG. 11 is a flowchart illustrating operations of forming a semiconductor device according to some embodiments of the inventive concepts.
Figure 12:
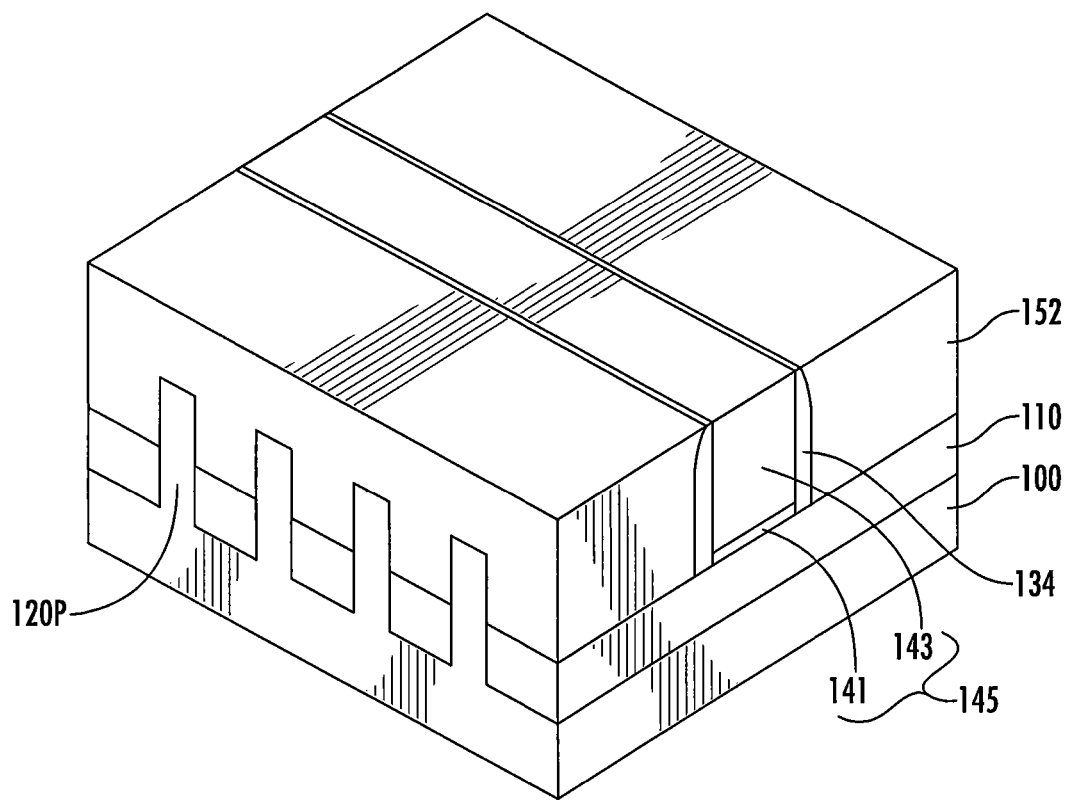
FIGS. 12 and 13 are perspective views illustrating intermediate structures provided in operations of forming a semiconductor device according to some embodiments of the inventive concepts.
Figure 13:
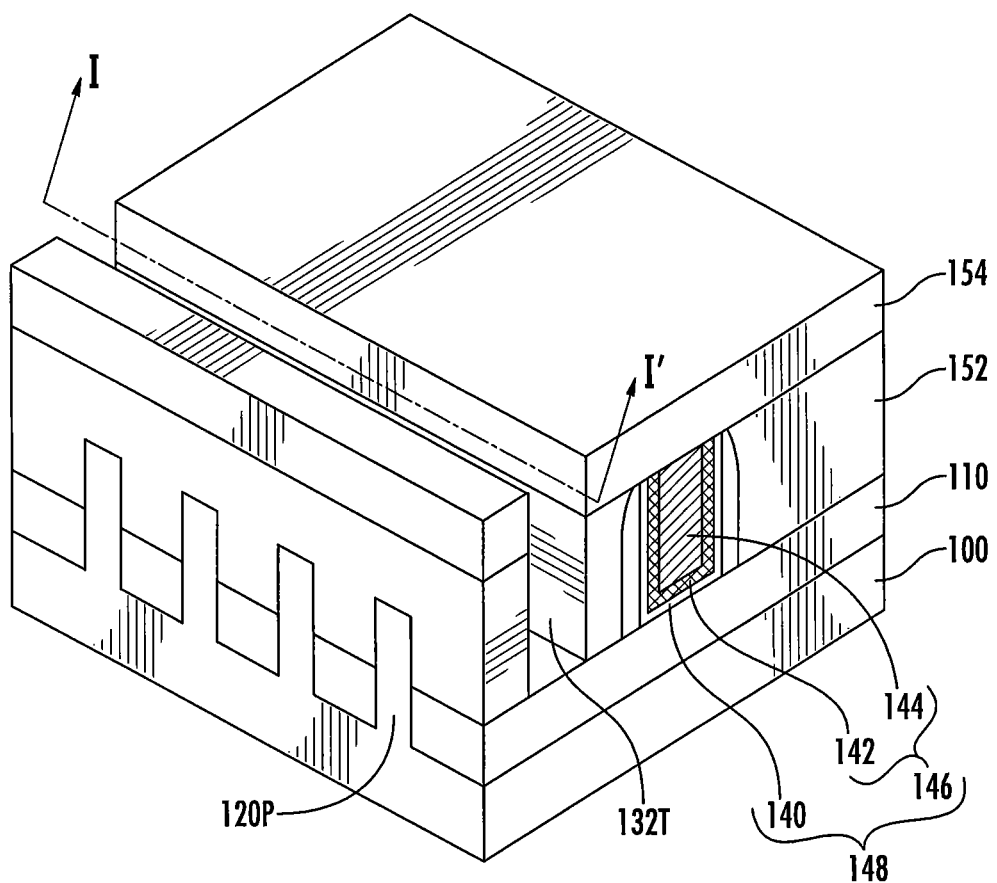

FIG. 11 is a flowchart illustrating operations of forming a semiconductor device according to some embodiments of the inventive concepts. FIGS. 12 and 13 are perspective views illustrating intermediate structures provided in operations of forming a semiconductor device according to some embodiments of the inventive concepts.

Referring to FIGS. 11 and 12, preliminary fin structures 120P and a dummy gate structure 145 may be formed on a substrate as illustrated in FIG. 4 (Block 100 and Block 110). A first insulation layer 152 may be formed on the structure illustrated in FIG. 4 (Block 210).

Referring to FIGS. 11 and 13, the dummy gate insulation layer 141 and the dummy gate electrode 143 may be replaced with a gate insulation layer 140 and a gate electrode 146 to form a gate structure (Block 300). A second insulation layer 154 may be formed on the first insulation layer 152 and the gate structure 148 (Block 310). An opening 132T may be formed in the first and second insulation layers 152, 154 by etching portions of the first and second insulation layers 152, 154 (Block 320). The opening 132T may expose upper surfaces of the preliminary fin structures 120P. The opening 132T may have a line shape.

Fin structures 120 may then be formed by removing upper portions of the preliminary fin structures 120P that are exposed by the opening 132T. Source/drain 130 may be formed on the fin structures 120 (Block 200). A metallic layer 132 may be formed on an upper surface of the source/drain 130 (Block 400). The resulting structure may be identical to the structure of FIG. 9.

Referring again to FIG. 10, a third insulation layer 156 may be formed in the opening 132T (Block 500-1). The third insulation layer 156 may fill the opening 132T. A contact 150 may be formed in the third insulation layer 156 (Block 600-1). The contact 150 may extend through the third insulation layer 156 and may contact the metallic layer 132.

FIGS. 14 through 17 are perspective views of semiconductor devices according to some embodiments of the inventive concepts.

Figure 14:
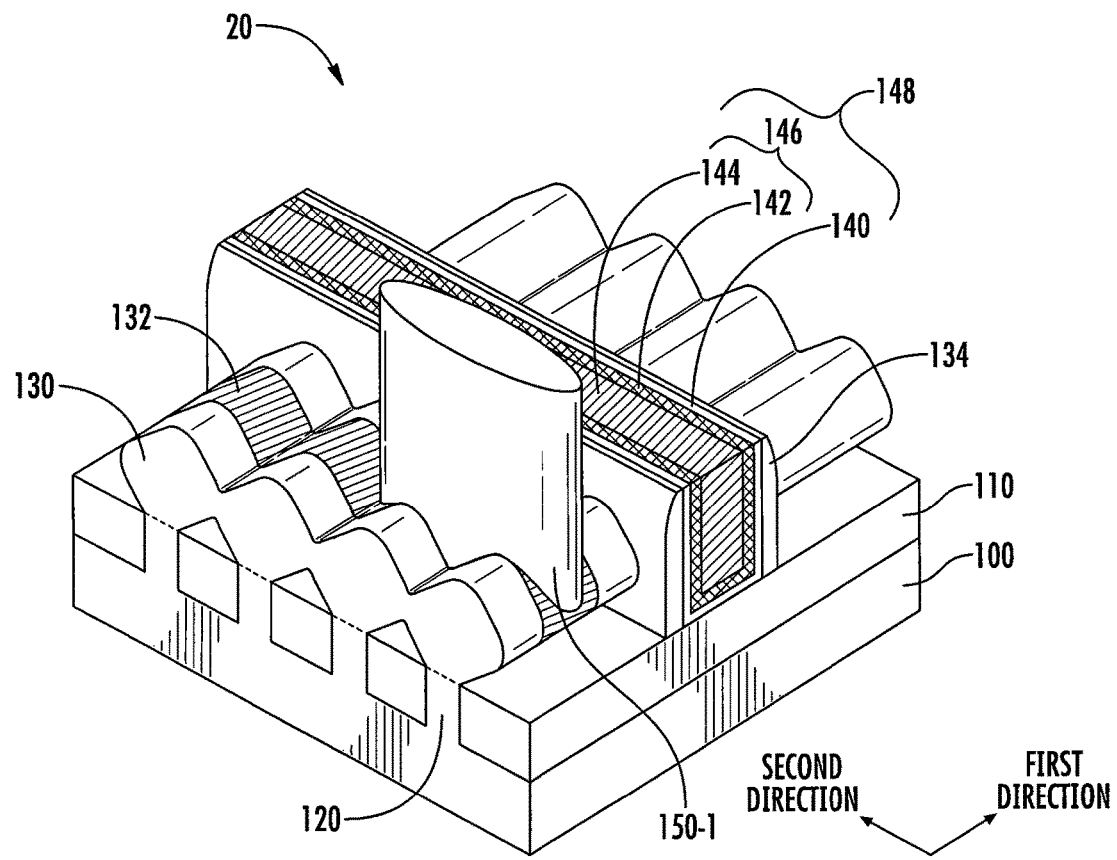
FIGS. 14 through 17 are perspective views of semiconductor devices according to some embodiments of the inventive concepts.

Referring to FIG. 14, a semiconductor device 20 may have a similar structure to the semiconductor device 10 of FIG. 1 except a contact 150-1. As shown in FIG. 14, the contact 150-1 may vertically overlap two of the fin structures 120 that are underneath the source/drain 130.

Figure 15:
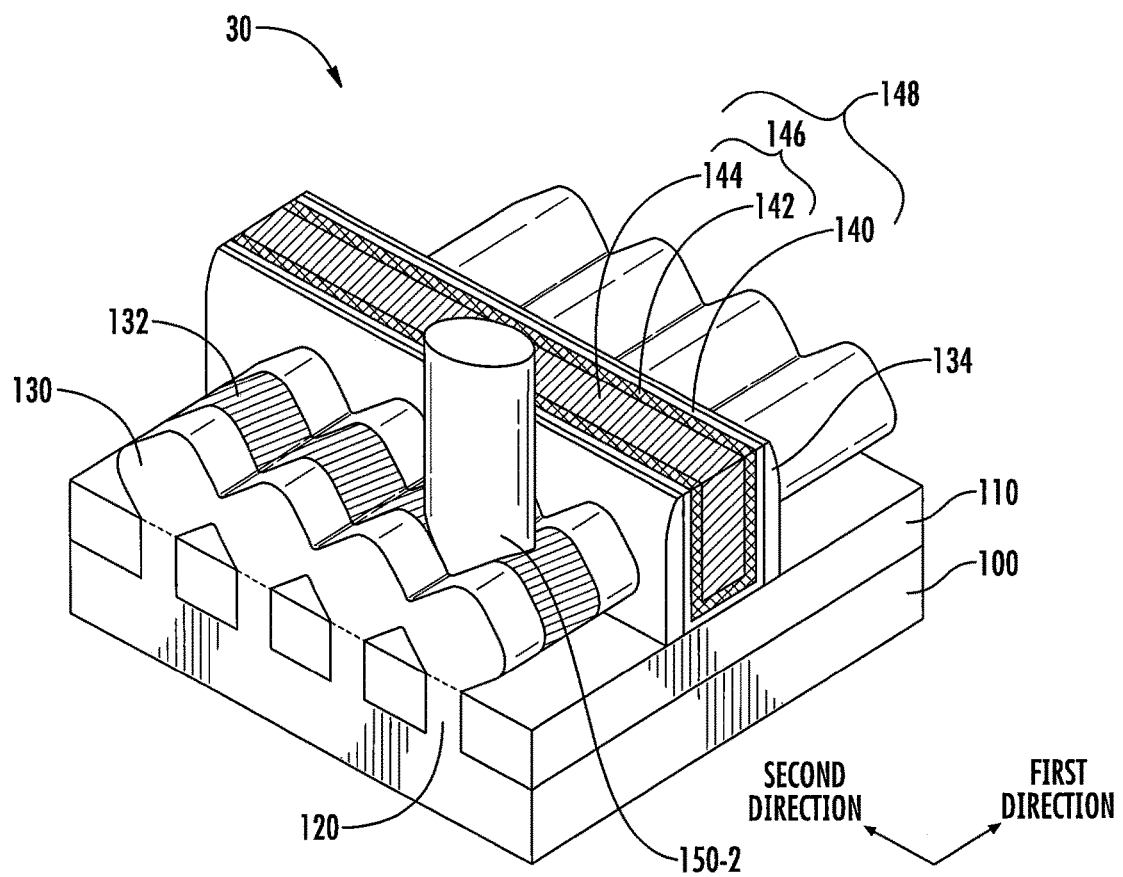

Referring to FIG. 15, a semiconductor device 30 may include a contact 150-2 that may vertically overlap portions of two of the fin structures 120 and a portion of the isolation layer 110 between the two of the fin structures 120.

Figure 16:
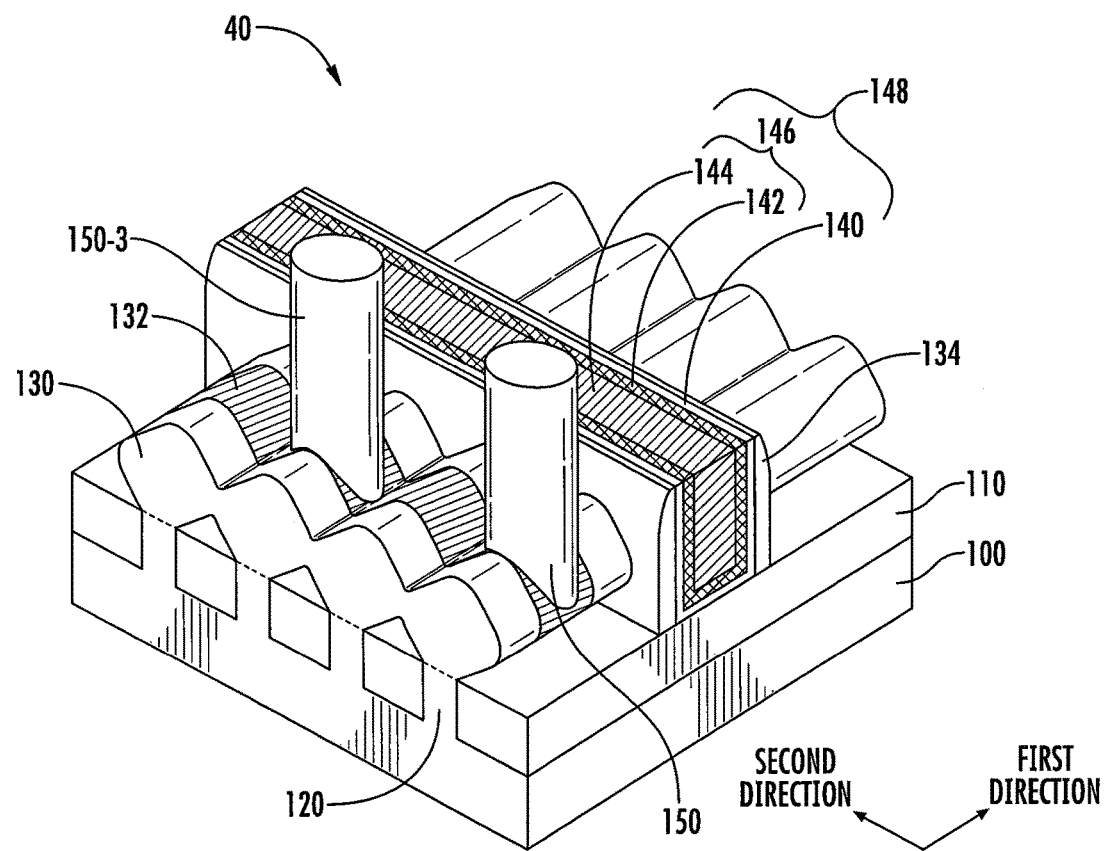

As shown in FIG. 16, a semiconductor device 40 may include two contacts, 150 and 150-3. The two contacts, 150 and 150-3, may have different shapes (e.g., different widths in the first direction or the second direction).

Figure 17:
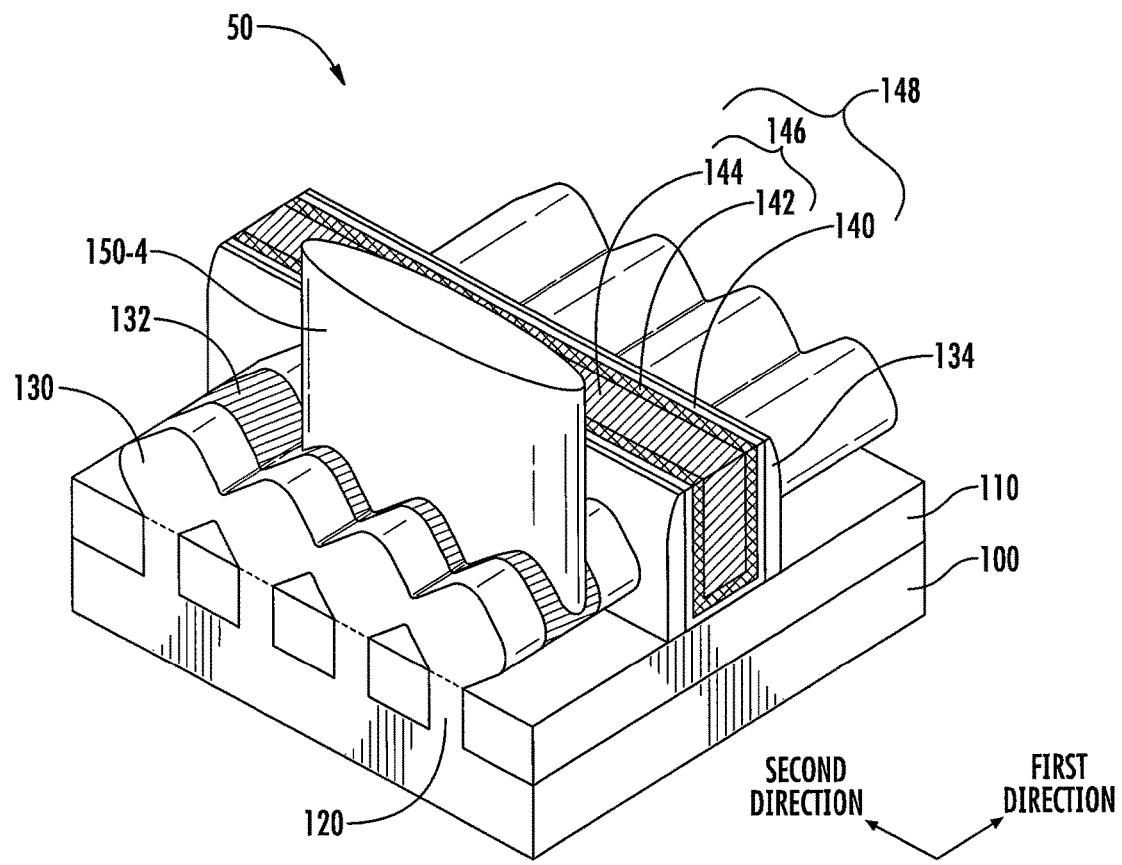

In some embodiments, a semiconductor device 50 may include a contact 150-4 that may vertically overlap more than one of the fin structures 120 and may have a width in the first direction less than a width of the metallic layer 132 in the first direction as shown in FIG. 17.

Although not shown in FIGS. 14-17, it will be understood that the semiconductor devices 20, 30, 40 and 50 may also include insulation layers (e.g., first, second and third insulation layers 152, 154 and 156 in FIG. 10) that are formed on the source/drain 130 and the gate structure 148 and enclose the contacts 150-1, 150-2, 150-3 and 150-4. The insulation layers may expose uppermost surfaces of the contacts 150-1, 150-2, 150-3 and 150-4.

Figure 18:
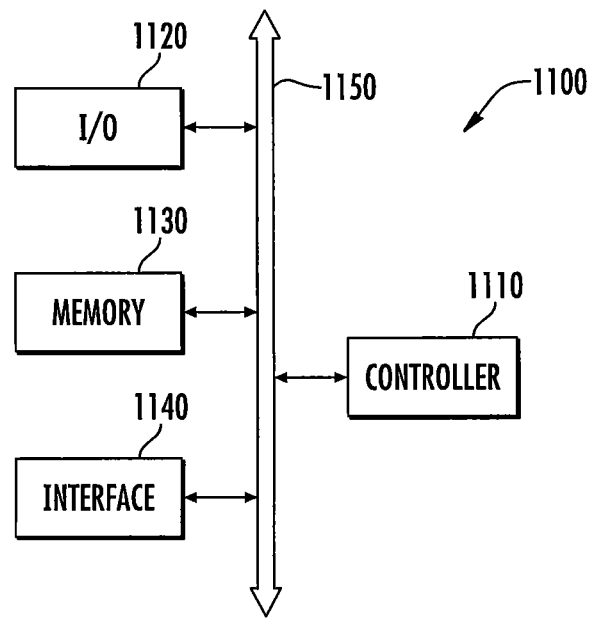
FIGS. 18 and 19 are block diagrams illustrating examples of electronic systems including a semiconductor device according to some embodiments of the inventive concepts.

FIG. 18 is a block diagram illustrating an example of an electronic system including a semiconductor device according to some embodiments of the inventive concepts. Referring to FIG. 18, an electronic system 1100 may include a controller 1110, an input/output (I/O) circuit 1120, a memory device 1130, an interface circuit 1140 and a data bus 1150. The controller 1110, the I/O circuit 1120, the memory device 1130 and the interface circuit 1140 may communicate with each other through the data bus 1150. The data bus 1150 may correspond to a path through which electrical signals are transmitted. The controller 1110, the I/O circuit 1120, the memory device 1130, and/or the interface circuit 1140 may include a semiconductor device according to some embodiments of the inventive concepts.

The controller 1110 may include at least one of a microprocessor, a digital signal processor, a microcontroller or another logic device. Another logic device may have a similar function to any one of the microprocessor, the digital signal processor and the microcontroller. The I/O circuit 1120 may include a keypad, a keyboard and/or a display unit. The memory device 1130 may store data and/or commands. The interface circuit 1140 may transmit electrical data to a communication network or may receive electrical data from a communication network. The interface circuit 1140 may operate wirelessly or over a cable. For example, the interface circuit 1140 may include an antenna for wireless communication or a transceiver for cable communication. The electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information wirelessly.

Figure 19:
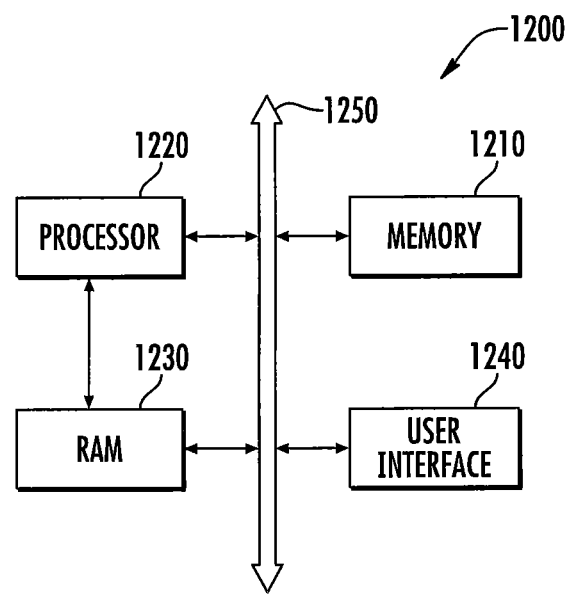

FIG. 19 is a block diagram illustrating an example of an electronic system including a semiconductor device according to some embodiments of the inventive concepts. Referring to FIG. 19, an electronic system 1200 may include at least one of semiconductor devices according to some embodiments of the inventive concepts. The electronic system 1200 may include a mobile device or a computer. For example, the electronic system 1200 may include a memory system 1210, a processor 1220, a random access memory (RAM) device 1230, and a user interface unit 1240 that communicate with each other through a data bus 1250. The processor 1220 may execute a program and may control the electronic system 1200. The RAM device 1230 may be used as an operational memory. For example, the processor 1220 and the RAM device 1230 may include the semiconductor devices according to some embodiments of the inventive concepts, respectively. Alternatively, the processor 1220 and the RAM device 1230 may be included in one package. The user interface unit 1240 may be used for data input/output to/from the electronic system 1200. The memory system 121Q may store data output from an external system or data processed by the processor 1220 or a code for operating the processor 1220. The memory system 1210 may include a controller and a memory device.

The electronic system 1200 may be realized as a mobile system, a personal computer, an industrial computer, or a logic system performing various functions. For example, the mobile system may be one of a personal digital assistant (PDA), a portable computer, a web tablet, a mobile phone, a wireless phone, a laptop computer, a memory card, a digital music player, and an information transmitting/receiving system. If the electronic system 1200 performs wireless communications, the electronic system 1200 may be used in a communication interface protocol of a third-generation communication system CDMA, GSM, NADC, E-TDMA, WCDMA, or CDMA2000.

Embodiments of the inventive concepts have been described above with reference to the accompanying drawings, in which example embodiments are shown. The inventive concepts may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout the drawings and specification. As used herein the expression "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the inventive concepts.

It will be understood that when an element is referred to as being "coupled to" or "connected to" or "on" another element, it can be directly coupled to, connected to or on the other element or intervening elements may also be present. In contrast, when an element is referred to as being "directly coupled to" or "directly connected to" or "directly on" another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, elements, and/or components, but do not preclude the presence or addition of one or more other features, elements, components, and/or groups thereof.

Embodiments of the inventive concepts have been described above with reference to perspective and cross-section illustrations that are schematic illustrations of idealized embodiments (and intermediate structures) of the inventive concepts. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the inventive concepts.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the perspective and cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the perspective and cross-sectional view(s) illustrated herein provide support for a plurality of devices according to various embodiments described herein that extend along two different directions in a plan view and/or in three different directions in a perspective view. For example, when a single source/drain is illustrated in a cross-sectional view of a device/structure, the device/structure may include a plurality of source/drains and transistor structures (or memory cell structures, gate structures, etc., as appropriate to the case) thereon, as would be illustrated by a plan view of the device/structure.

All embodiments can be combined in any way and/or combination.

In the drawings and specification, there have been disclosed typical embodiments of the inventive concepts and, although specific terms are employed, they are used in a generic and descriptive sense only and not for purposes of limitation, the scope of the inventive concepts being set forth in the following claims.

What is claimed is:

1. A method of forming a semiconductor device comprising:
    forming a plurality of fin-shaped channels on a substrate;
    forming a gate structure crossing over the plurality of fin-shaped channels;
    forming a source/drain adjacent a side of the gate structure, the source/drain crossing over the plurality of fin-shaped channels and being electrically connected to the plurality of fin-shaped channels;
    forming a metallic layer on an upper surface of the source/drain; and
    forming a conductive contact on the metallic layer opposite the source/drain, the conductive contact having a first length in a longitudinal direction of the metallic layer that is less than a second length of the metallic layer in the longitudinal direction of the metallic layer.

2. The method of claim 1, wherein forming the metallic layer comprises:
    forming an insulation layer on the gate structure and the source/drain;

forming an opening extending through the insulation layer and exposing at least a portion of the source/drain; and
forming the metallic layer on the source/drain.

3. The method of claim 2, wherein the second length of the metallic layer in the longitudinal direction of the metallic layer is greater than a distance between two adjacent ones of the plurality of fin-shaped channels.

4. The method of claim 2, wherein the insulation layer comprises a first insulation layer, and
wherein forming the gate structure comprises:
forming a dummy gate structure crossing over the plurality of fin-shaped channels;
forming a second insulation layer on sides of the dummy gate structure; and
replacing the dummy gate structure with a gate insulation layer and a gate electrode, the gate electrode comprising a metal.

5. The method of claim 2, wherein the insulation layer comprises a first insulation layer, and
wherein forming the conductive contact comprises:
forming a second insulation layer on the metallic layer in the opening;
forming a contact opening extending through the second insulation layer and exposing the metallic layer; and
forming the conductive contact in the contact opening.

6. The method of claim 1, wherein the metallic layer comprises a silicide layer and/or a stack of layers, and
wherein the stack of layers comprises a stack comprising a dielectric layer and a metal layer or a stack comprising a rare-earth or alkaline earth metal layer, a metal layer and a capping layer.

7. The method of claim 1, wherein forming the source/drain and the metallic layer comprises:
forming an insulation layer on the plurality of fin-shaped channels and the gate structure;
forming an opening extending through the insulation layer and exposing the plurality of fin-shaped channels;
forming the source/drain in the opening by performing a epitaxial growth process using the plurality of fin-shaped channels that are exposed by the opening as seed layers; and
forming the metallic layer on the source/drain.

8. A method of forming a semiconductor device comprising:
forming a plurality of fin-shaped channels on a substrate;
forming a gate structure crossing over the plurality of fin-shaped channels;
forming a source/drain adjacent a side of the gate structure, the source/drain crossing over the plurality of fin-shaped channels and being electrically connected to the plurality of fin-shaped channels;
forming a metallic layer on an upper surface of the source/drain; and
forming a conductive contact on the metallic layer opposite the source/drain, the conductive contact vertically overlapping less than all of the plurality of fin-shaped channels.

9. The method of claim 8, wherein the metallic layer vertically overlaps a first number of the plurality of fin-shaped channels that is greater than a second number of the plurality of fin-shaped channels that the conductive contact vertically overlaps.

10. The method of claim 9, wherein the metallic layer vertically overlaps all of the plurality of fin-shaped channels.

11. The method of claim 8, wherein the conductive contact vertically overlaps only a portion of the metallic layer in a longitudinal direction of the metallic layer.

12. The method of claim 8, wherein forming the metallic layer and the conductive contact comprises:
forming a first insulation layer on the gate structure and the source/drain;
forming an opening extending through the first insulation layer and exposing the source/drain;
forming the metallic layer on the source/drain;
forming a second insulation layer on the metallic layer in the opening;
forming a contact opening extending through the second insulation layer and exposing the metallic layer; and
forming the conductive contact in the contact opening.

13. The method of claim 12, wherein forming the gate structure comprises:
forming a dummy gate structure crossing over the plurality of fin-shaped channels;
forming a third insulation layer on sides of the dummy gate structure; and
replacing the dummy gate structure with a gate insulation layer and a gate electrode, the gate electrode comprising a metal.

14. The method of claim 8, wherein the metallic layer comprises a silicide layer and/or a stack of layers, and
wherein the stack of layers comprises a stack comprising a dielectric layer and a metal layer or a stack comprising a rare-earth or alkaline earth metal layer, a metal layer and a capping layer.

15. A method of forming a semiconductor device comprising:
forming a plurality of fin-shaped channels on a substrate;
forming a gate structure crossing over the plurality of fin-shaped channels;
forming a source/drain adjacent a side of the gate structure, the source/drain crossing over the plurality of fin-shaped channels and being electrically connected to the plurality of fin-shaped channels; and
forming a conductive contact on an upper surface of the source/drain, the conductive contact having a first length in a longitudinal direction of the source/drain that is less than a second length of the source/drain in the longitudinal direction of the source/drain.

16. The method of claim 15, wherein the conductive contact vertically overlaps only a portion of the plurality of fin-shaped channels.

17. The method of claim 15, further comprising forming a metallic layer between the source/drain and the conductive contact, wherein the metallic layer has a third length in the longitudinal direction of the source/drain that is greater than the first length of the conductive contact.

18. The method of claim 15, further comprising forming a metallic layer between the source/drain and the conductive contact, wherein forming the metallic layer and the conductive contact comprises:
forming a first insulation layer on the gate structure and the source/drain;
forming an opening extending through the first insulation layer and exposing the source/drain;
forming the metallic layer on the source/drain;
forming a second insulation layer on the metallic layer in the opening;
forming a contact opening extending through the second insulation layer and exposing the metallic layer; and
forming the conductive contact in the contact opening, the conductive contact contacting the metallic layer.

19. The method of claim 18, wherein forming the gate structure comprises:

forming a dummy gate structure crossing over the plurality of fin-shaped channels;
forming a third insulation layer on sides of the dummy gate structure; and
replacing the dummy gate structure with a gate insulation layer and a gate electrode, the gate electrode comprising a metal.

20. The method of claim 15, further comprising forming a metallic layer between the source/drain and the conductive contact, wherein the metallic layer comprises a silicide layer and/or a stack of layers, and
wherein the stack of layers comprises a stack comprising a dielectric layer and a metal layer or a stack comprising a rare-earth or alkaline earth metal layer, a metal layer and a capping layer.

* * * * *